United States Patent
Clark et al.

[11] Patent Number: 5,917,272
[45] Date of Patent: Jun. 29, 1999

[54] OVEN-HEATED CRYSTAL RESONATOR AND OSCILLATOR ASSEMBLY

[75] Inventors: Roger J. Clark, Bethel; Samuel Shniper, Wilton; Jacob M. Li, Danbury, all of Conn.; David Lane, Beverly, Mass.; Otmar Boser, Scarsdadle, N.Y.

[73] Assignee: Vectron, Inc., Norwalk, Conn.

[21] Appl. No.: 09/096,026

[22] Filed: Jun. 11, 1998

[51] Int. Cl.[6] .................................................. H01L 41/08
[52] U.S. Cl. ........................ 310/343; 310/346; 219/210; 331/69
[58] Field of Search ................................. 310/341–344, 310/348, 346; 219/209, 210; 331/68–70, 116 R, 116 FE, 66

[56] References Cited

U.S. PATENT DOCUMENTS

| | | | |
|---|---|---|---|
| 2,952,786 | 9/1960 | Lewis | 310/321 X |
| 3,382,452 | 5/1968 | Rempel et al. | 331/3 |
| 3,431,392 | 3/1969 | Garland et al. | 219/210 |
| 3,619,806 | 11/1971 | Phillips | 331/69 |
| 3,715,563 | 2/1973 | Bloch | 310/343 X |
| 3,715,653 | 2/1973 | Bloch | 219/210 |
| 4,259,606 | 3/1981 | Vig | 310/343 |
| 4,334,168 | 6/1982 | Besson et al. | 310/343 |
| 4,396,892 | 8/1983 | Frerking et al. | 331/69 |
| 4,586,006 | 4/1986 | Emmons | 331/69 |
| 4,611,182 | 9/1986 | Chauvin et al. | 331/69 |
| 4,627,533 | 12/1986 | Pollard | 206/328 |
| 4,748,367 | 5/1988 | Block et al. | 310/343 |
| 4,839,613 | 6/1989 | Echols et al. | 331/69 |
| 4,845,337 | 7/1989 | Goldberg et al. | 219/210 |
| 4,985,687 | 1/1991 | Long | 331/69 |
| 5,004,987 | 4/1991 | Hurley | 331/70 |
| 5,025,228 | 6/1991 | Gerard et al. | 331/69 |
| 5,041,800 | 8/1991 | Long et al. | 331/69 |
| 5,180,942 | 1/1993 | Marvin et al. | 310/346 |
| 5,200,714 | 4/1993 | Hayashi | 331/66 |
| 5,289,075 | 2/1994 | Besson et al. | 310/367 |
| 5,438,219 | 8/1995 | Kotzan et al. | 257/469 |
| 5,500,628 | 3/1996 | Knecht | 331/68 |
| 5,530,408 | 6/1996 | Vig et al. | 331/69 |
| 5,656,189 | 8/1997 | Crockett et al. | 219/99 |
| 5,659,270 | 8/1997 | Millen et al. | 331/69 |
| 5,729,181 | 3/1998 | Cutler et al. | 331/69 |
| 5,794,126 | 8/1998 | Tsutsumi et al. | 455/40 |

FOREIGN PATENT DOCUMENTS

| | | | |
|---|---|---|---|
| 0168713 | 9/1984 | Japan | 310/343 |
| 0980251 | 12/1982 | U.S.S.R. | 310/343 |
| 698076 | 10/1953 | United Kingdom | 310/343 |

*Primary Examiner*—Mark O. Budd
*Attorney, Agent, or Firm*—St. Onge Steward Johnston & Reens LLC

[57] ABSTRACT

A crystal resonator assembly is described wherein a piezoelectric resonator is mounted over a heat conducting substrate and one or more heat generating elements are located on the substrate. The heating elements provide heat both by conduction and radiation and by virtue of the use of a heat conducting substrate enable a uniform and efficient heating of the crystal resonator to a desired oven temperature.

9 Claims, 2 Drawing Sheets

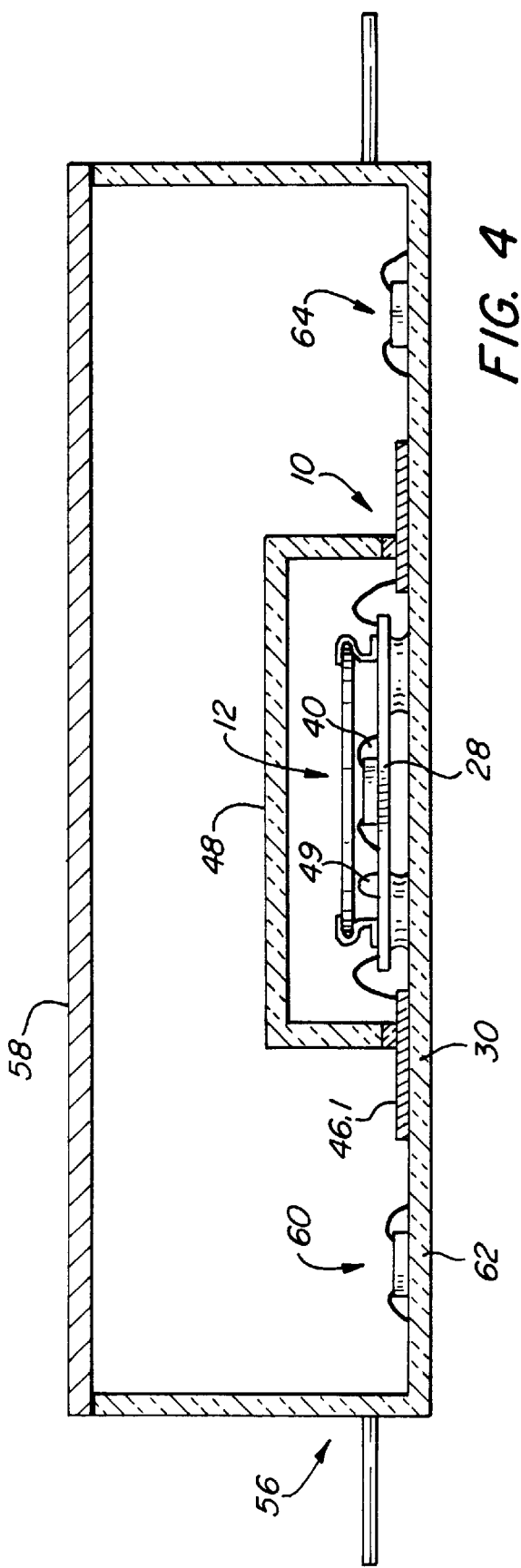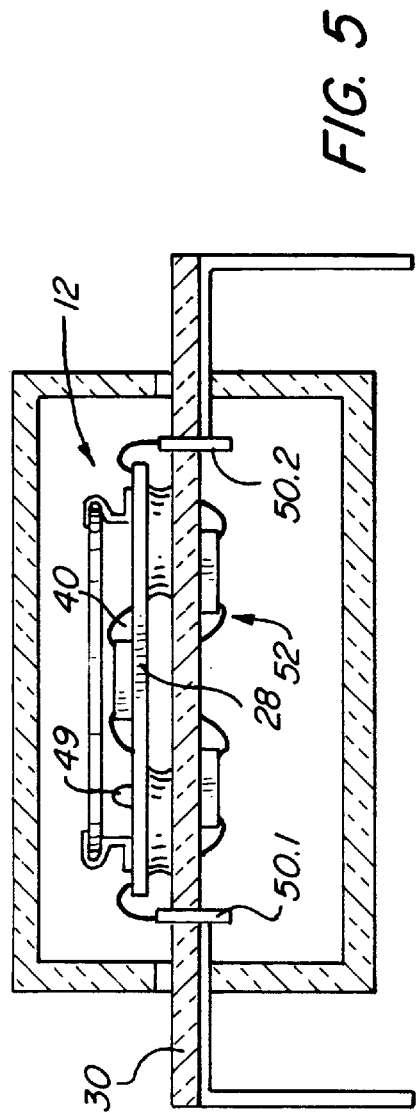

5,917,272

OVEN-HEATED CRYSTAL RESONATOR AND OSCILLATOR ASSEMBLY

FIELD OF THE INVENTION

This invention relates to crystal oscillators generally and more specifically to an assembly including so-called oven controlled oscillators in which a piezo-electric resonator is maintained at a desired temperature inside an enclosure.

BACKGROUND OF THE INVENTION

Oven controlled crystal oscillators, frequently known as OCXO's, are well known in the industry. Generally, crystal resonators resonate at a frequency which varies with temperature. The magnitude of this variation is frequently controlled by using temperature compensation obtained with heat generating devices such as thermisters, resistors and infrared radiation. In U.S. Pat. 4,259,606 an infrared heater is employed to provide radiative heating of the resonator inside a vacuum and thus reduce the time needed to stabilize the operating frequency of the resonator. The resonator is supported by insulator mounts, which have thin conductors to make electrical contact with the operative surfaces of the resonator plate. The entire structure is then placed inside an evacuated enclosure with infrared radiation being applied through a window from outside the evacuated enclosure.

U.S. Pat. Nos. 5,500,628 and 5,438,219 describe a double sided oscillator package wherein a piezo element is mounted below a platform while other circuit components are located above the platform and wires are embedded inside the platform. Another OCXO is described in U.S. Pat. 5,180,942 which issued to Marvin et al. A ceramic package for a crystal oscillator is described in U.S. Pat. No. 4,627,533.

Although these prior art devices can be useful for portable applications, a problem arise from an inefficient heating of the resonator and the consequential reduction of the useful life of a battery charge.

SUMMARY OF THE INVENTION

It is, therefore an object of the invention to provide an oven controlled crystal resonator for use in an oscillator and which uses oven generated heat in an efficient manner. It is a further object of the invention to provide an infrared heated OCXO which is efficient so that its drain upon powering batteries is reduced and their useful charge is extended.

In one oven controlled crystal resonator in accordance with the invention the resonator is mounted in a heat conducting manner over a heat conductive substrate, which in turn is mounted in a heat insulating manner over a base. The substrate is formed of a heat conducting material and carries one or several heating elements. The heat from the heater element and the heated substrate is conducted to the resonator to establish its desired temperature while the insulated structure with the base prevents excessive loss of heat In this manner the resonator can be maintained at an elevated temperature without excessive drain of battery energy. A cover engages the base and encloses the resonator, substrate and electrical leads connecting the substrate to conductors on the base. The electrical leads are made of very fine wires to limit heat conduction there through so as to limit heat losses from the resonator.

These and other advantages and object of the invention can be understood from the following description of several embodiments of the invention as illustrated in the drawings.

BRIEF DESCRIPTION OF THE DRAWINGS

FIG. 4 is a cross-sectional view of a crystal controlled oscillator using an oven controlled crystal resonator in accordance with the invention;

FIG. 5 is a cross-sectional view of a another form of a crystal controlled oscillator in accordance with the invention;

DETAILED DESCRIPTION OF DRAWINGS

Figure 1:
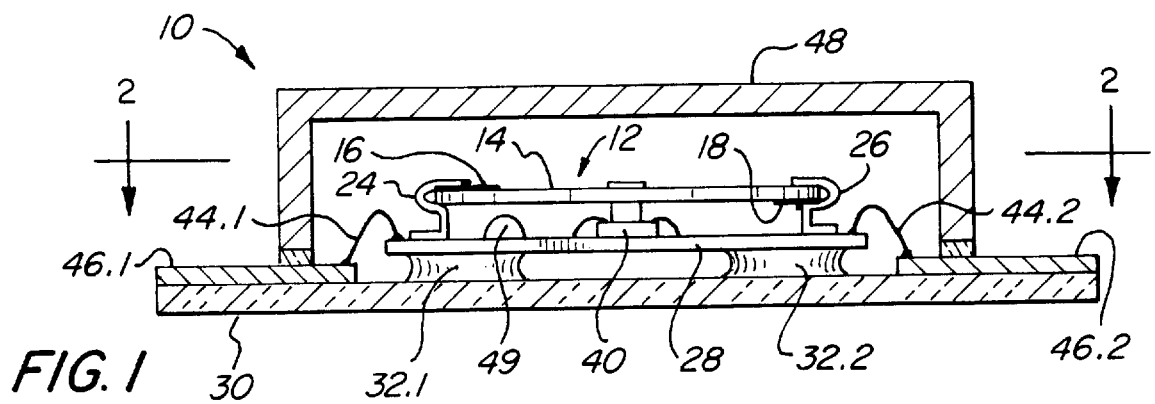
FIG. 1 is a cross-sectional view of an oven controlled crystal resonator in accordance with the invention.
Figure 2:
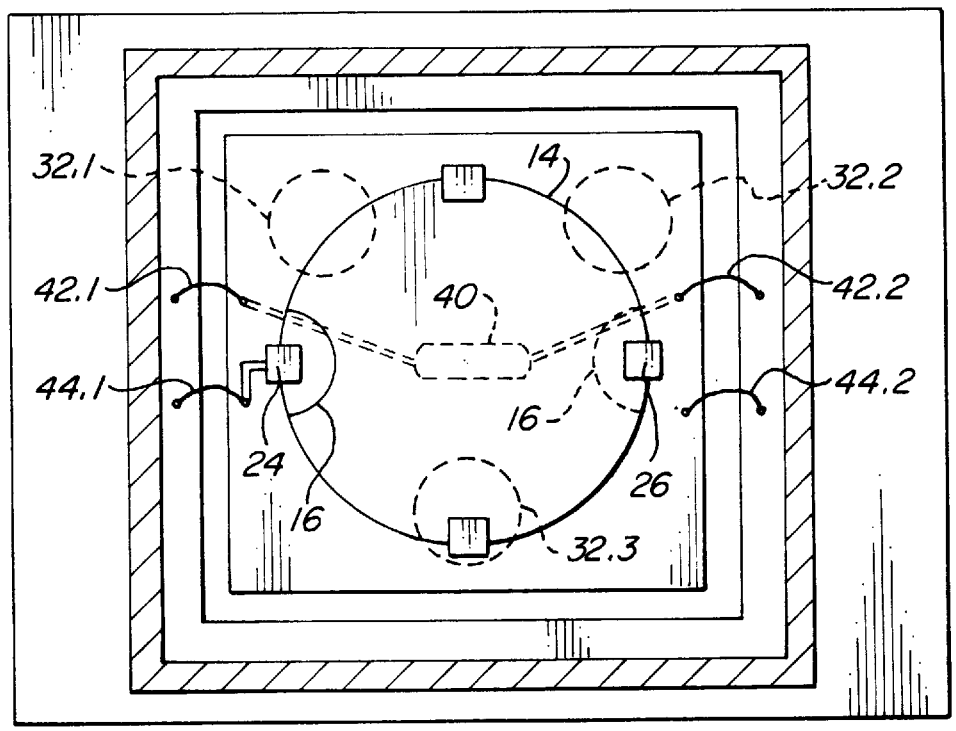
FIG. 2 is a plan section view of the oven controlled crystal resonator of FIG. 1 taken along the line 2—2 in FIG. 1.

With reference to FIGS. 1 and 2 an oven controlled crystal resonator 10 is shown formed with a standard crystal resonator 12 such as a piezo-electric crystal 14. The crystal 14 is made of a material which is well known in the art and has a flat construction with electrodes 16 and 18 on opposite surfaces 20, 22 of the crystal 14. The electrodes 16, 18 are connected to electrically and high heat conducting rigid clips 24, 26 which in turn are mounted to a substrate 28. The substrate 28 in turn is mounted to a base 30 with rigid non-heat conducting insulators 32.1–3.

The substrate 28 is formed of a high heat conducting but electrically insulative ceramic material such as beryllium oxide or aluminum nitride or such other similar suitable material. The ceramic substrate 28 is characterized by a very low temperature gradient across the plane, i.e. the surface 34, of the substrate 28.

One or several heater elements 40 are mounted on the heat conducting substrate 28 and electrically connected to a power source via leads 42.1 and 42.2. These leads 42 are made as small in cross-section as is practical so that little heat is conducted through leads 42 away from substrate 28. Similarly, leads 44.1 and 44.2 connect the clips 24, 26 respectively to appropriate conductor lands 46.1 and 46.2 on the base 30. A cover 48 encloses the crystal resonator assembly 12 to form, with the base 30, a sealed chamber, that can be filled with a gas or evacuated as are well known techniques used in the manufacture of crystal oscillators. A temperature sensor 49 is placed on the heated substrate 28 as part of a conventional control circuit coupled thereto and to the heater elements 40 to regulate the substrate 28's temperature.

The base 30 can be made of a ceramic, metal or other suitable material. The low-heat conducting thermal insulation posts 32 can be made of glass and fused to the base 30 or glued to it. The cover 48 can be metal and is sealed to the base 30. The clips can be affixed to the ceramic substrate 28 with a suitable heat conducting epoxy material.

With a crystal resonator in accordance with the invention a significant improvement in the efficiency is obtained because about 5% to 10% of the heat required for conventional devices can be used to operate the crystal resonator at the desired temperature.

Figure 3:
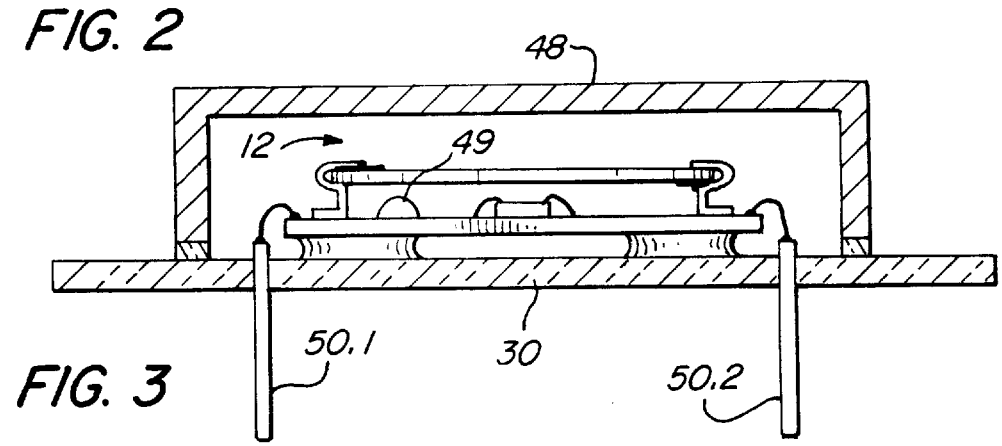
FIG. 3 is a cross-sectional view of another oven controlled crystal resonator in accordance with the invention.

FIG. 3 illustrates a similar crystal resonator 12 as in FIG. 1, but with lands 46 replaced by conductors 50 extending through the base 30. Such structure can be used for example to connect the crystal oscillator with an oscillator circuit 52 located below the base 30 as shown in FIG. 5. FIG. 4 illustrates a crystal oscillator assembly 56 wherein a crystal resonator 12 as illustrated in FIG. 1 is shown in turn encapsulated by a cover 58 that also encloses an oscillator circuit 60 on an extended segment 62 of the base 30. Temperature sensitive oscillator components 49 may also be placed on the heated substrate 28 and coupled to a conventional control circuit 64 that can be mounted on the segment 62. The circuit 64 in turn is coupled to drive the heater elements 40 to establish a desired temperature of the substrate 28.

Having thus described several embodiments in accordance with the invention, its advantages can be appreciated. Variations from the illustrated drawings and descriptions can be made without departing from the scope of the invention as determined by the following claims. For example, the resonator 12 can be a surface acoustic wave device that is directly bonded to the heated substrate 28.

What is claimed is:

1. An oven controlled resonator assembly comprising:

a base;

a heat conductive electrically insulating substrate having a surface with a low temperature gradient characteristic;

the substrate being supported over the base with a plurality of rigid heat insulating posts;

a heater element mounted on the substrate so as to heat it to a desired temperature extending substantially evenly across the surface to provide radiant and conducting heat from said substrate surface;

a crystal resonator having contacts and a generally flat construction, said crystal resonator being mounted generally parallel with the surface to the substrate with heat conducting and electrically conducting elements extending from the substrate to the crystal resonator, the crystal resonator being closely spaced to the substrate so as to be uniformly heated thereby to a desired temperature;

electrical leads connecting electrical conductors located on the base to electrical conductors on said substrate, said electrical leads being sized so as to limit heat conduction therethrough; and a cover enclosing said crystal resonator and said substrate and said electrical leads so as to provide a sealed chamber therefor with said base;

whereby said crystal resonator can be uniformly heated to said desired temperature in an efficient manner with low heat loss.

2. The oven controlled resonator assembly as claimed in claim 1 wherein said posts are formed of glass rods fused to said base and said heat conductive electrically insulating substrate.

3. The oven controlled resonator as claimed in claim 1 wherein said posts are formed of glass rods glued to said base and said substrate.

4. The oven controlled resonator as claimed in claim 1 wherein said heater element is an infrared emitting element operatively facing said crystal resonator so as to heat it with infrared radiation and heat said substrate by heat conduction from said infrared emitting element.

5. The oven controlled resonator as claimed in claim 4 wherein said infrared emitting element comprises an infrared emitting diode oriented to emit infrared radiation at said crystal resonator.

6. The oven controlled resonator as claimed in claim 1, and further including circuit means mounted on said substrate for controlling the emission of said radiation from said surface and said heat conduction to maintain said desired temperature of the crystal resonator.

7. The oven controlled resonator as claimed in claim 1 wherein the space enclosed by the cover and the base is a vacuum.

8. The oven controlled resonator as claimed in claim 1 and further including a temperature sensor operatively located on the substrate and circuit means coupled thereto and to said heater element to regulate the heat produced therefrom and establish said desired temperature of said substrate.

9. An oven controlled oscillator, comprising:

a base;

a heat conductive electrically insulating substrate having a surface with a low temperature gradient characteristic;

the substrate being supported over the base with a plurality of rigid heat insulating posts;

a heater element mounted on the substrate so as to heat it to a desired temperature extending substantially evenly across the surface to provide radiant and conducting heat from said substrate surface; a temperature sensor mounted on said substrate;

a crystal resonator having contacts and a generally flat construction, said crystal resonator being mounted generally parallel with the surface to the substrate with heat conducting and electrically conducting elements extending from the substrate to the crystal resonator, the crystal resonator being closely spaced to the substrate so as to be uniformly heated thereby to a desired temperature;

electrical leads connecting electrical conductors located on the base to electrical conductors on said substrate, said electrical conductors being coupled to said heater element and said temperature sensor, said electrical leads being sized so as to limit heat conduction therethrough;

an oscillator circuit and a temperature control circuit mounted on said base and electrically connected to said electrical leads so as to maintain said desired temperature of said substrate;

cover means enclosing said crystal resonator and said substrate, said electrical leads and said oscillator circuit so as to provide a sealed chamber therefor with said base;

whereby said crystal oscillator can be operated at a precisely controlled frequency for an extended time period from a battery powered source by heating the resonator uniformly to said desired temperature in an efficient manner with low heat loss.

* * * * *

UNITED STATES PATENT AND TRADEMARK OFFICE
CERTIFICATE OF CORRECTION

PATENT NO. : 5,917,272
DATED : June 29, 1999
INVENTOR(S) : Clark, et al.

It is certified that error appears in the above-identified patent and that said Letters Patent is hereby corrected as shown below:

On the title page item [75]Inventor: "Roger J. Clark" should read -- Roger L. Clark --.

Signed and Sealed this

Fourth Day of January, 2000

Attest:

Attesting Officer

Acting Commissioner of Patents and Trademarks